(12) United States Patent
Yoon et al.

(10) Patent No.: US 8,093,696 B2
(45) Date of Patent: Jan. 10, 2012

(54) SEMICONDUCTOR DEVICE

(75) Inventors: Kimyung Yoon, Dresden (DE); Stephan Dobritz, Dresden (DE); Stefan Ruckmich, Dresden (DE)

(73) Assignee: Qimonda AG, Munich (DE)

( * ) Notice: Subject to any disclaimer, the term of this patent is extended or adjusted under 35 U.S.C. 154(b) by 249 days.

(21) Appl. No.: 12/122,215

(22) Filed: May 16, 2008

(65) Prior Publication Data

US 2009/0283899 A1    Nov. 19, 2009

(51) Int. Cl.
*H01L 23/02* (2006.01)
(52) U.S. Cl. ........................................ 257/678; 257/698
(58) Field of Classification Search .................. 257/678, 257/698

See application file for complete search history.

(56) References Cited

U.S. PATENT DOCUMENTS

| 7,093,358 B2* | 8/2006 | Akram et al. ................. 29/874 |
| 7,525,186 B2* | 4/2009 | Kim et al. ..................... 257/686 |
| 2002/0008325 A1* | 1/2002 | Tominaga ..................... 257/778 |
| 2005/0002763 A1* | 1/2005 | Kampf et al. ................. 414/403 |
| 2007/0007641 A1 | 1/2007 | Lee et al. |
| 2007/0108609 A1* | 5/2007 | Kang et al. .................... 257/737 |
| 2007/0170942 A1 | 7/2007 | Akram et al. |

OTHER PUBLICATIONS

Trichur, R.K., et al., "A Photosensitive, Spin-Applied Masking Material for Through-Silicon Via Formation for Wafer-Level Packaging," International Wafer Level Packaging Conference, Sep. 17, 2007, Conference Proceedings, 7 pages.

* cited by examiner

*Primary Examiner* — Thien F Tran

(57) ABSTRACT

According to one embodiment of the present invention, a semiconductor device is provided, that includes a semiconductor carrier; a cavity formed within the semiconductor carrier, the cavity extending from the top surface of the semiconductor carrier into the semiconductor carrier; and at least one semiconductor chip provided within the cavity.

12 Claims, 14 Drawing Sheets

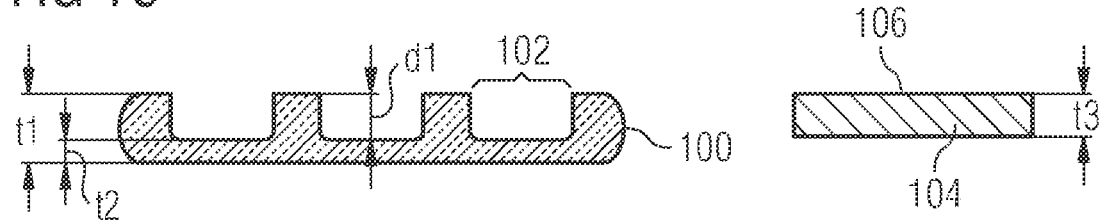
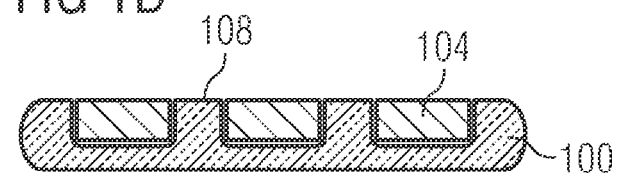
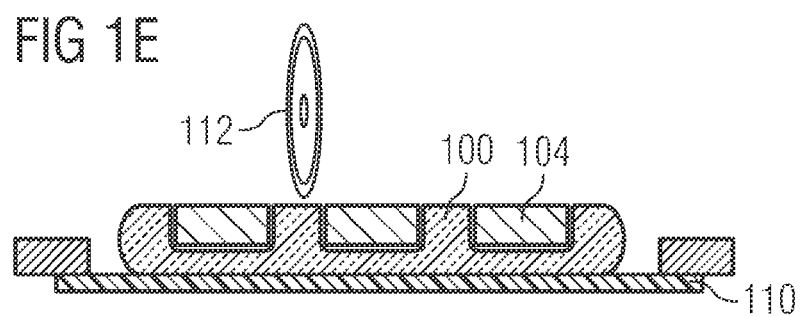

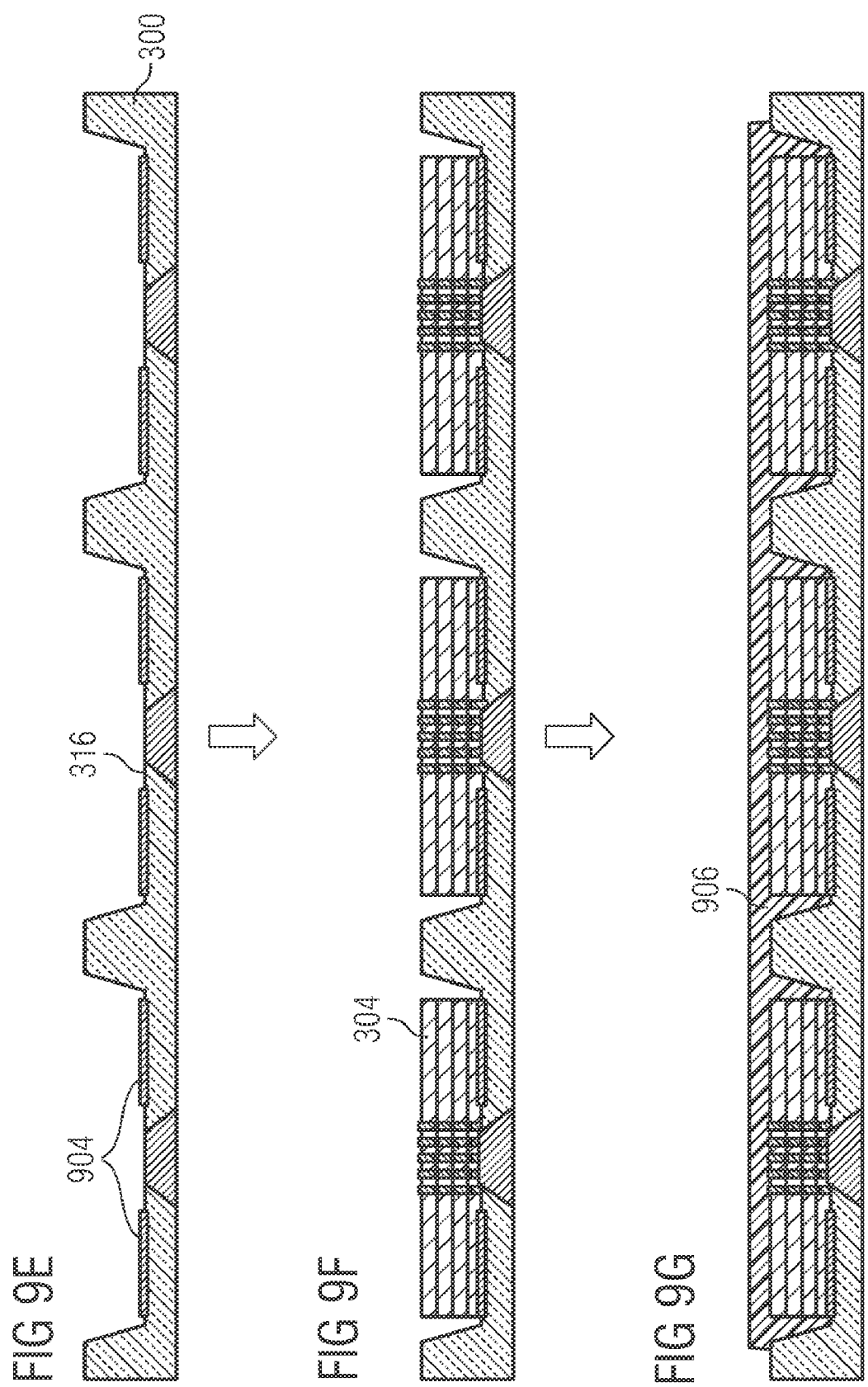

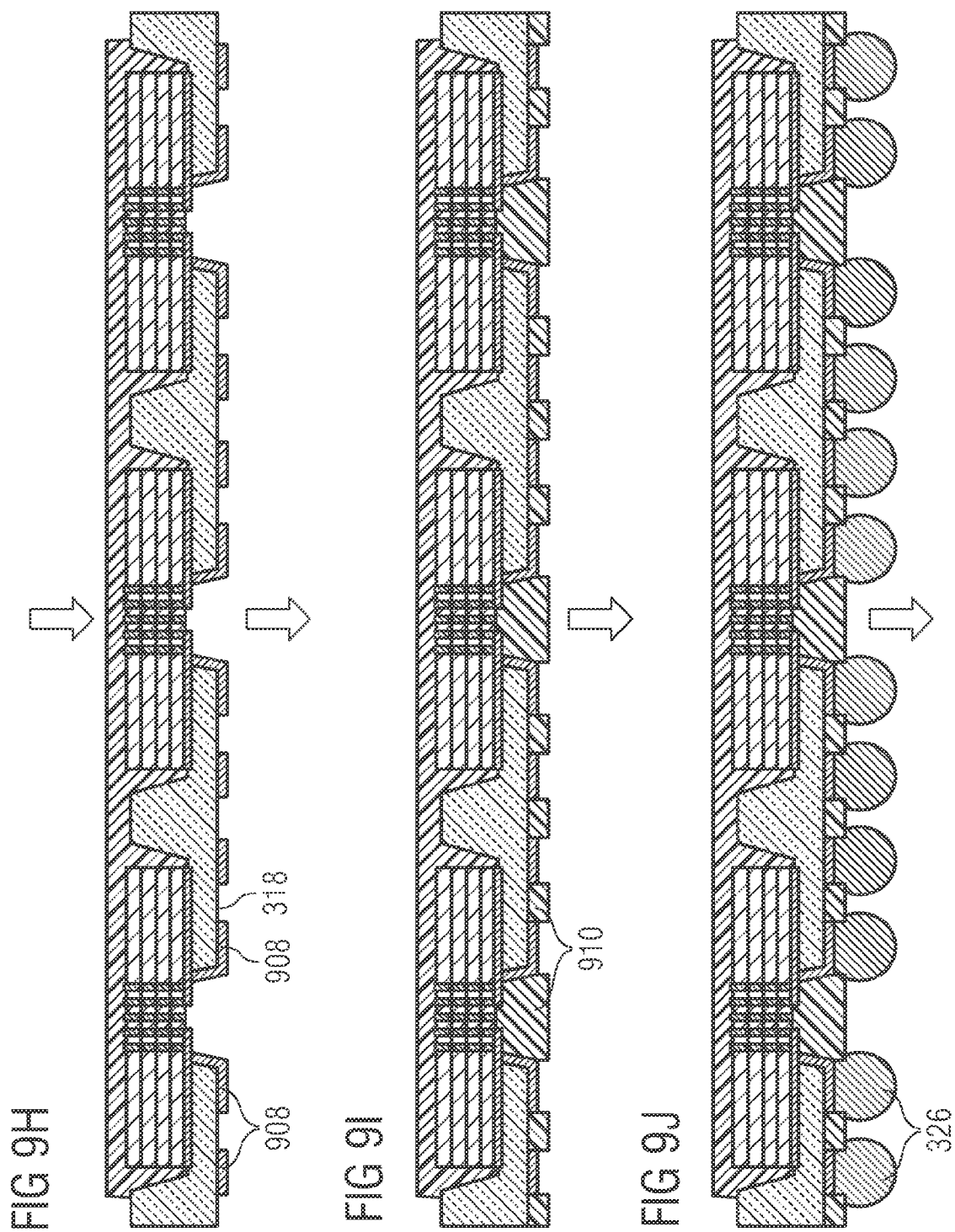

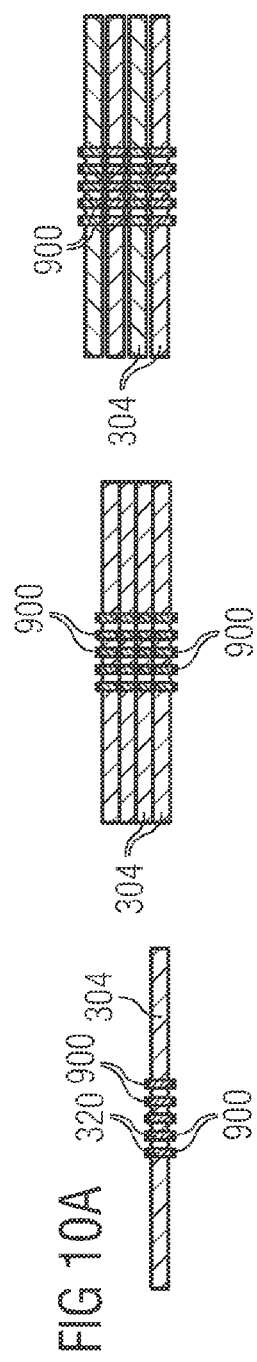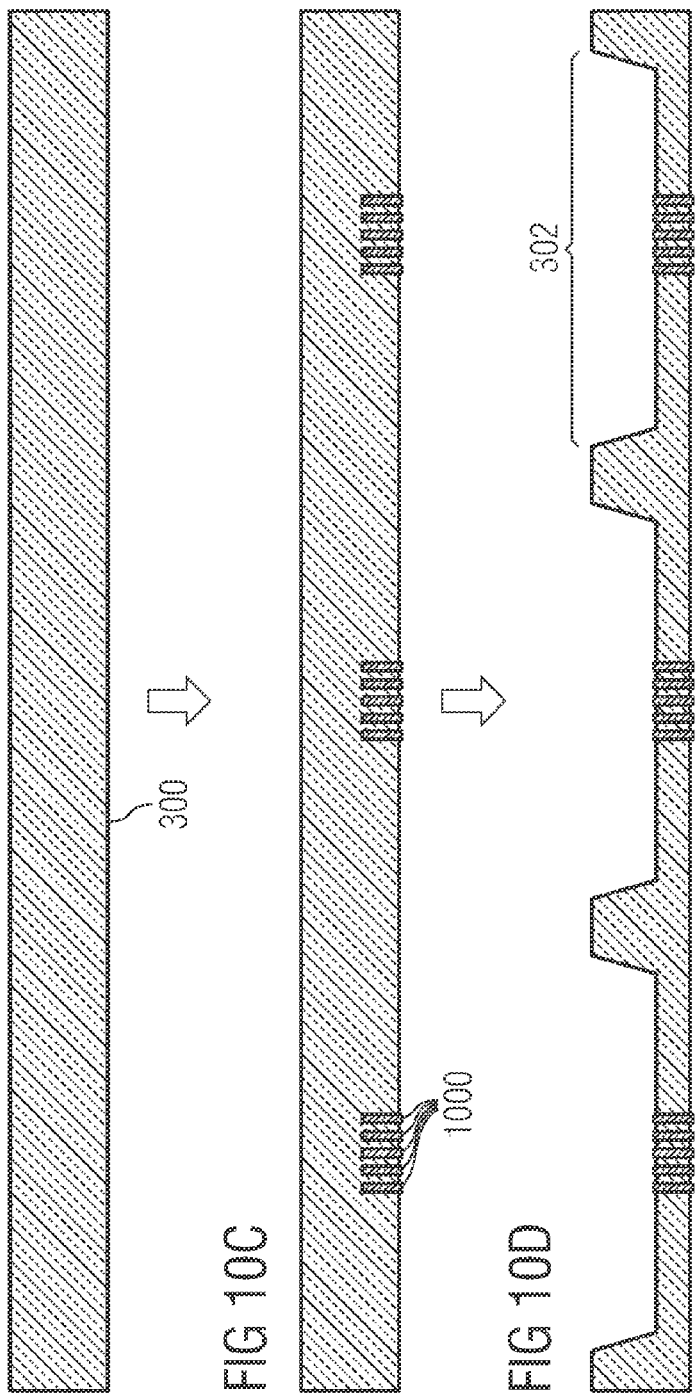

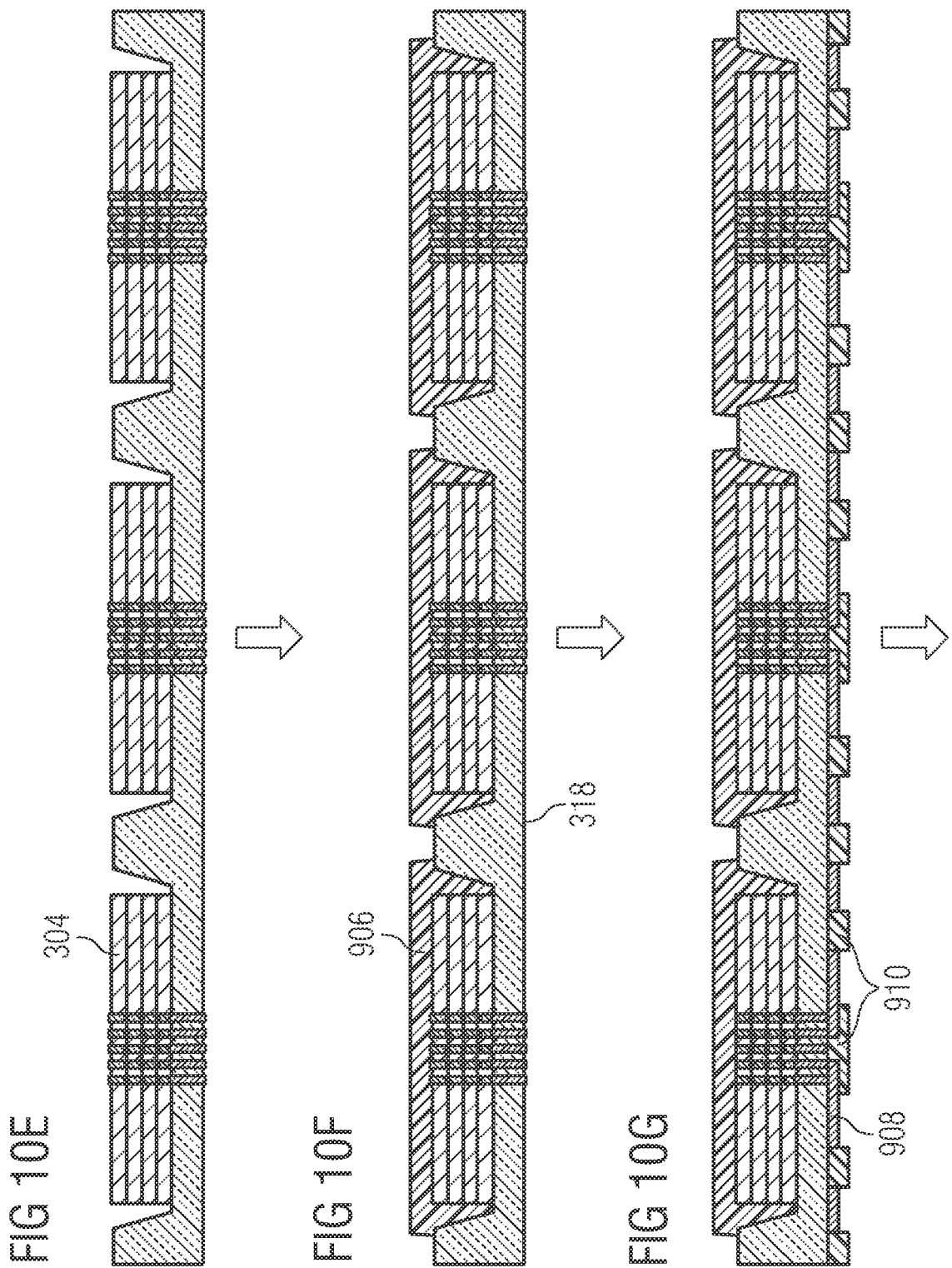

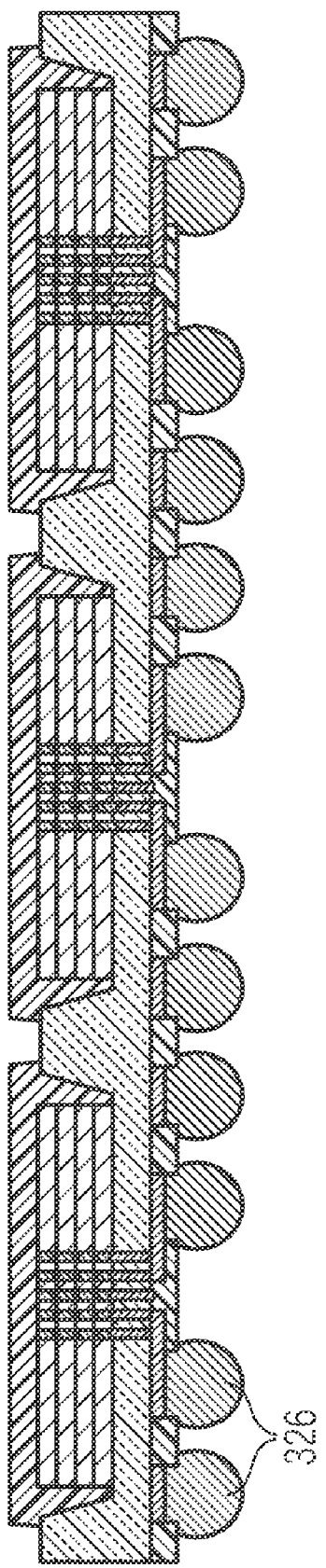
FIG 10H
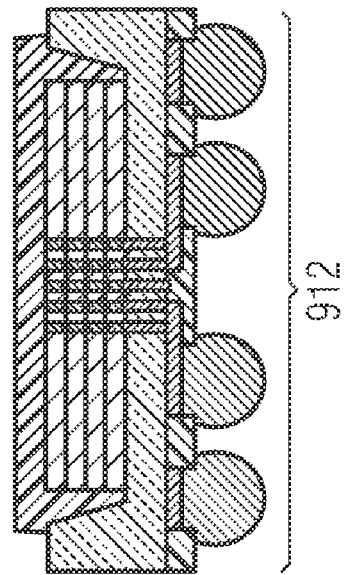
FIG 10I
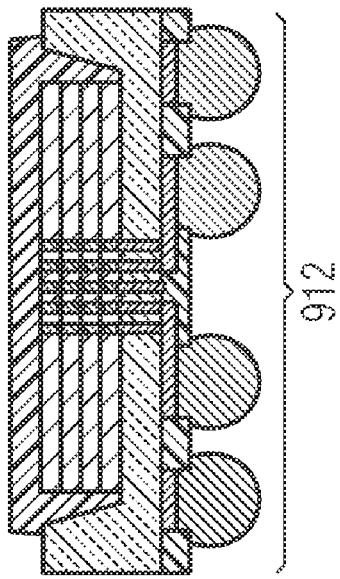

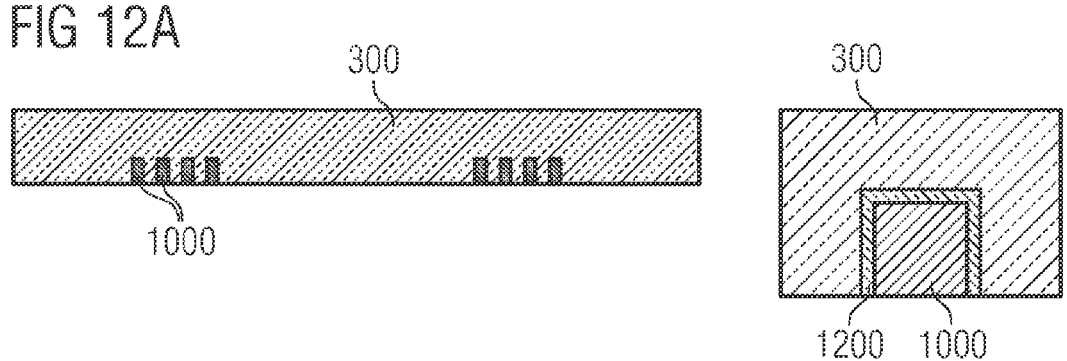
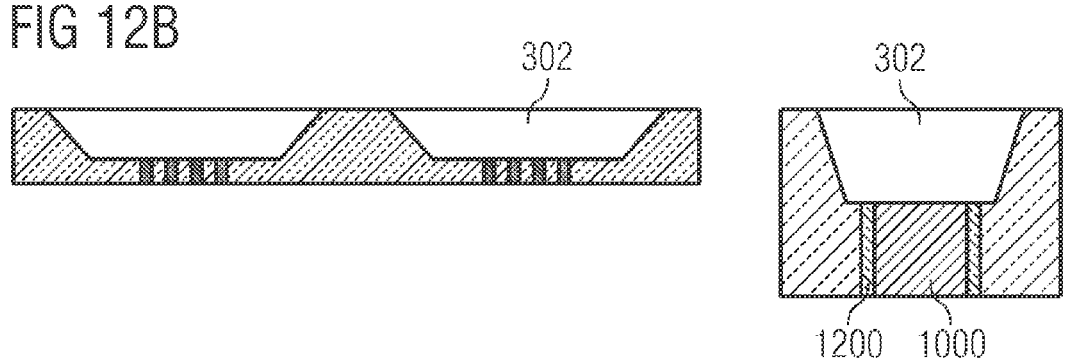

SEMICONDUCTOR DEVICE

TECHNICAL FIELD

The present invention relates to a semiconductor device and a method of manufacturing a semiconductor device.

Semiconductor chips are used in many technical fields. Usually, several semiconductor chips are formed in parallel within or on a semiconductor wafer. Then, the semiconductor wafer is singularized into semiconductor chips. Depending on the use of the semiconductor chips, the semiconductor chips may be packaged.

SUMMARY OF THE INVENTION

According to one embodiment of the present invention, a semiconductor device is provided, including a semiconductor carrier, a cavity formed within the semiconductor carrier, the cavity extending from the top surface of the semiconductor carrier into the semiconductor carrier, and at least one semiconductor chip provided within the cavity.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 1A to 1E show schematic cross-sectional views of manufacturing stages of a method of manufacturing semiconductor chips according to one embodiment;

FIGS. 9A to 9K show schematic cross-sectional views of manufacturing stages of a method of manufacturing semiconductor chips according to one embodiment;

FIGS. 10A to 10I show schematic cross-sectional views of manufacturing stages of a method of manufacturing semiconductor chips according to one embodiment;

FIGS. 12A to 12B show schematic cross-sectional views of manufacturing stages of a method of manufacturing semiconductor chips according to one embodiment.

DETAILED DESCRIPTION OF ILLUSTRATIVE EMBODIMENTS

Figure 2A:
FIGS. 2A to 2F show schematic cross-sectional views of manufacturing stages of a method of manufacturing semiconductor chips according to one embodiment.

FIG. 1A shows a manufacturing stage obtained after having provided a semiconductor wafer 100. FIG. 1B shows a manufacturing stage obtained after having thinned (grinded) the semiconductor wafer 100. FIG. 1C shows a manufacturing stage obtained after having formed cavities 102 within the semiconductor wafer 100. The cavities 102 may, for example, be formed using a dry etching process or a wet etching process. According to one embodiment, a thickness t1 of the thinned wafer 100 is lower than 500 µm. According to one embodiment of the present invention, a depth d1 of the cavities ranges between 60 µm and 500 µm. According to one embodiment of the present invention, a thickness t2 of the parts of the semiconductor wafer 100 located below the cavities is lower than 200 µm. According to one embodiment, a thickness t2 of the parts of the semiconductor wafer 100 located below the cavities is larger than 50 µm. It is to be understood that the embodiments of the present invention are not limited to these thicknesses/depths given above. FIG. 1D shows a manufacturing stage obtained after having placed semiconductor chips 104 ("dies") into the cavities 102. According to one embodiment, the depth d1 of the cavities 102 is chosen in dependence on a thickness t3 of semiconductor chips 104. For example, the parameters d1 and t3 may be chosen such that the top surface 106 of the semiconductor chips which are placed into the cavities 102 are positioned below the top surface 108 of the semiconductor wafer 100. One effect of this is that the semiconductor chips 104 are better protected against possible mechanical damage during subsequent manufacturing stages. According to one embodiment, the semiconductor chips 104 may also be replaced by a stack of semiconductor chips, respectively. FIG. 1E shows a manufacturing stage obtained after having fixed the semiconductor wafer 100 by a supporting structure 110 (e.g., a dicing tape). Then, the semiconductor wafer 100 can be singularized into semiconductor devices using, for example, a saw 112 or a laser, thereby obtaining single semiconductor devices.

One effect of using the method described above is that no extra carrier to be fixed to the semiconductor wafer 100 and later on to be removed from the semiconductor wafer 100 has to be used. Instead, the semiconductor wafer itself is both used as a semiconductor carrier during the manufacturing process and later on as a part of the semiconductor device. Further, the cavities 102 protect the semiconductor chips 104 or stacks of semiconductor chips from being damaged when singularizing the semiconductor wafer 100. In this way, both a simplified and safer way to manufacturing semiconductor devices is obtained.

Figure 2B:
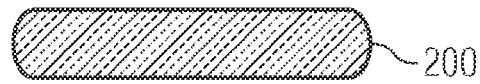
Figure 2C:
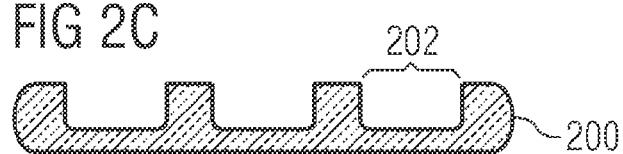
Figure 2D:
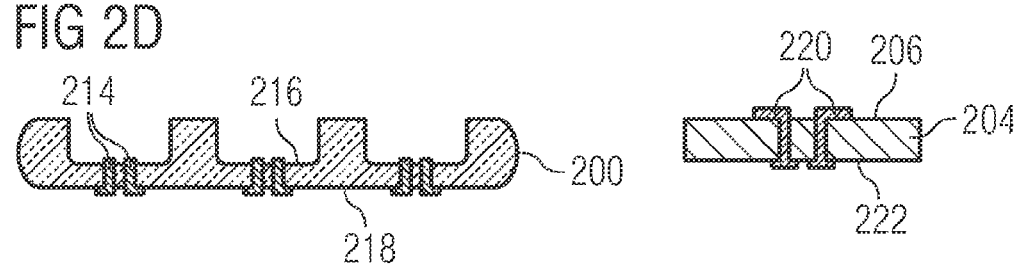
Figure 2E:
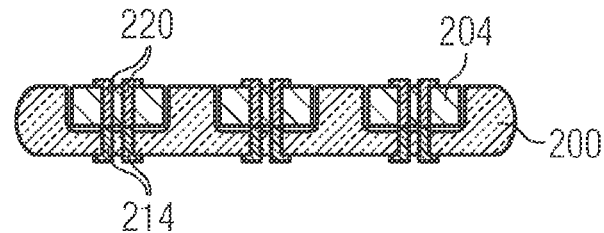
Figure 2F:
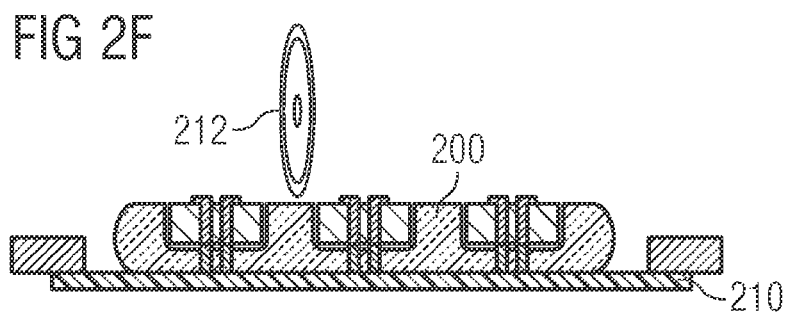

FIG. 2A shows a manufacturing stage obtained after having provided a semiconductor wafer 200. FIG. 2B shows a manufacturing stage obtained after having thinned (grinded) the semiconductor wafer 200. FIG. 2C shows a manufacturing stage obtained after having formed cavities 202 within the semiconductor wafer 200. The cavities 202 may, for example, be formed using a dry etching process or a wet etching process. FIG. 2D shows a manufacturing stage obtained after having formed conductive vias 214 extending through the semiconductor wafer 200. The vias 214 extend from a bottom surface 216 of the cavities 202 to a bottom surface 218 of the semiconductor substrate 200. Further, semiconductor chips 204 have been provided having conductive vias 220 extending from a top surface 206 to a bottom surface 222 of the semiconductor chips 204. The vias 214, 220 are positioned such that the upper ends of the vias 220 can contact the lower ends of the vias 214 when placed into the cavities 202. The ends of the vias 214, 220 can be melted together using solder material, for example. FIG. 2E shows a manufacturing stage obtained after having placed semiconductor chips 204 into the cavities 202. FIG. 2F shows a manufacturing stage obtained after having fixed the semiconductor wafer 200 by a supporting structure 210 (e.g., a dicing tape). Then, the semiconductor wafer can be singularized into semiconductor devices using, for example, a saw 212 or a laser, thereby obtaining single semiconductor devices. According to one embodiment, the semiconductor chips 204 may also be replaced by a stack of semiconductor chips, respectively. According to one embodiment, the same thickness ranges/depth ranges as mentioned in conjunction with FIGS. 1A to 1E apply.

FIGS. 3 to 8 show embodiments of semiconductor devices which may be obtained using the manufacturing methods shown in FIGS. 1 and 2.

Figure 3:
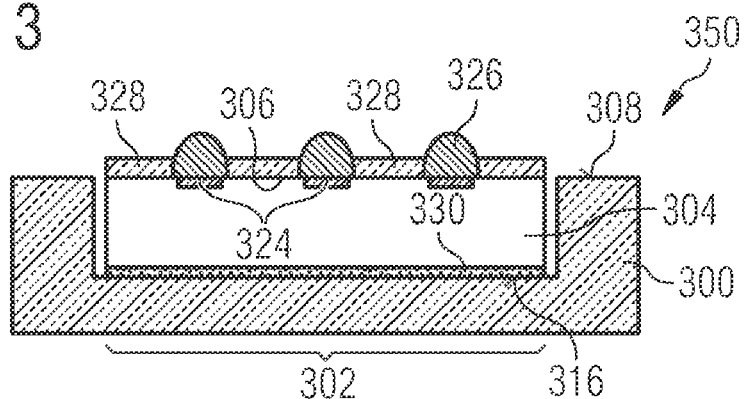
FIG. 3 shows a schematic cross-sectional view of a semiconductor device according to one embodiment.

FIG. 3 shows a semiconductor device 350, including: a semiconductor carrier 300; a cavity 302 formed within the semiconductor carrier 300, the cavity 302 extending from the top surface 308 of the semiconductor carrier 300 into the semiconductor carrier 300; and a semiconductor chip 304 provided within the cavity 302, wherein the semiconductor chip 304 includes at least one integrated circuit. "Integrated circuit" may, for example, mean a memory circuit like a PCRAM (phase changing random access memory) circuit, a MRAM (magneto-resistive random access memory) circuit, a CBRAM (conductive bridging random access memory) circuit, processing circuitry, logical circuitry, etc. According to one embodiment, the vertical position of the top surface 306 of the semiconductor chip 304 provided within the cavity 302 is lower than the vertical position of the top surface 308 of the semiconductor carrier 300 (good protection of the semiconductor chip 304). The semiconductor chip 304 includes chip contacting areas 324 for contacting the at least one integrated circuit (not shown). Here, the chip contacting areas 324 are located on the top surface 306 of the semiconductor chip 304. On the chip contacting areas 324, solder balls 326 are provided. The semiconductor chip 304 may be replaced by a plurality of semiconductor chips stacked above each other. Between the solder balls 326, solder stop material 328 may be provided. Here, the semiconductor chip 304 is attached to the bottom surface 316 of the cavity 302 by an adhesive layer 330. The adhesive layer 330 may, for example, include solder material or epoxy material. Here, the chip contacting areas 324 are also the device contacting areas for externally contacting the semiconductor device 350.

Figure 4:
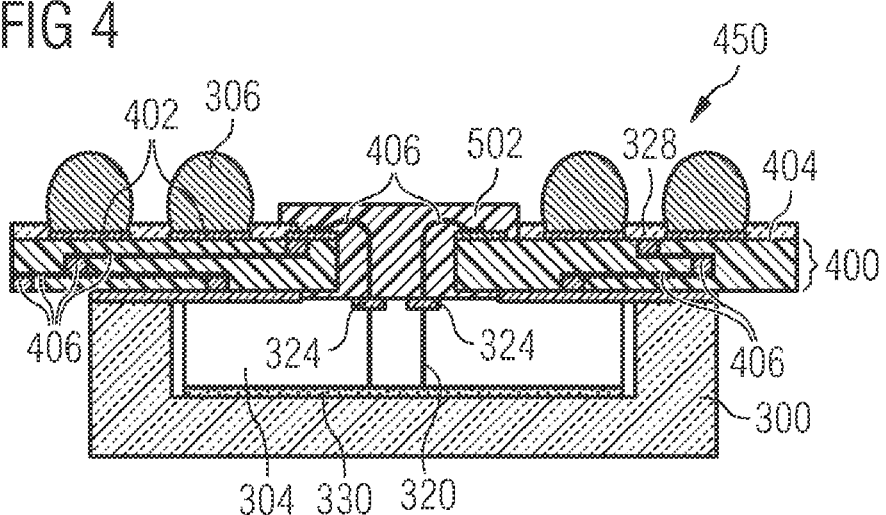
FIG. 4 shows a schematic cross-sectional view of a semiconductor device according to one embodiment.

FIG. 4 shows a semiconductor device 450 being similar to the semiconductor device 350. However, in addition, a circuit board is 400 is provided on parts of the top surface 306 of the semiconductor chip 304 and on the top surface 308 of the semiconductor carrier 300. Further, the semiconductor device 450 has device contacting areas 402 for externally contacting the semiconductor device 450 being located on the top surface 404 of the circuit board 400, wherein the chip contacting areas 324 are electrically connected to the device contacting areas 402 by electrical connections 406 provided within or on the circuit board 400. The device contacting areas 402 are covered by solder material 326.

Figure 5:
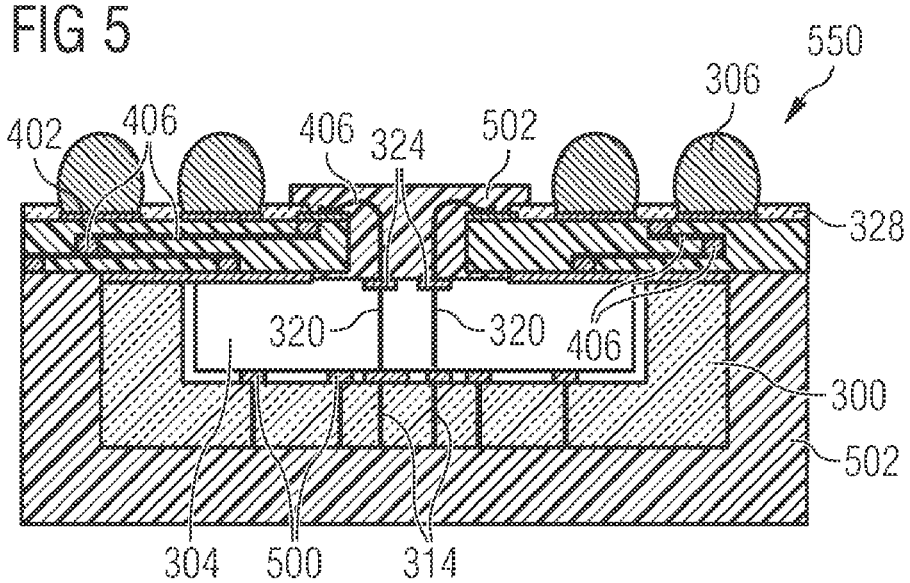
FIG. 5 shows a schematic cross-sectional view of a semiconductor device according to one embodiment.

FIG. 5 shows a semiconductor device 550 being similar to the semiconductor device 450. In addition, the semiconductor chip 304 includes conductive vias 320 extending through the semiconductor chip 304. Further, the semiconductor carrier 300 includes conductive vias 314 extending through the semiconductor carrier 300. The vias 320 are electrically connected to the vias 314 by electrical connections 500. Integrated circuits may be provided both within the semiconductor chip 304 and in the semiconductor carrier 300. That is, the semiconductor carrier 300 may itself be a semiconductor chip comprising an integrated circuit, wherein, within the back side of the semiconductor chip (i.e., the semiconductor carrier 300), a cavity 302 has been formed. In other words: Two semiconductor chips (the semiconductor chip 304 and the semiconductor carrier 300) are stacked above each other, each of them including at least one integrated circuit, wherein one of the semiconductor chips (the semiconductor carrier 300) serves as semiconductor carrier for the (at least one) other semiconductor chip (the semiconductor chip 304) which is placed within a cavity 302 formed within the one semiconductor chip (the semiconductor carrier 300). The integrated circuits may for example be connected to the vias 314, 320, respectively. The lower part of the semiconductor device 550 is encapsulated by protection structure 502 like a molding mass.

Figure 6:
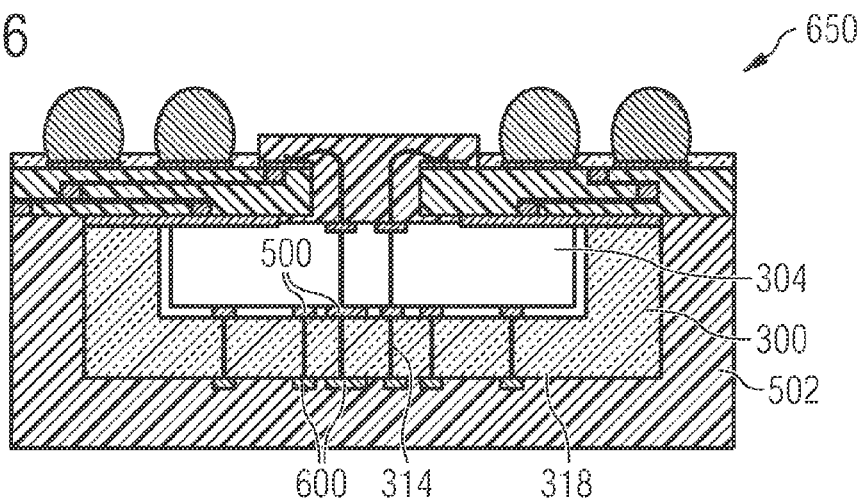
FIG. 6 shows a schematic cross-sectional view of a semiconductor device according to one embodiment.

FIG. 6 shows a semiconductor device 650 being similar to the semiconductor device 550. In addition, on the bottom surface 318 of the semiconductor carrier 300, electrical connections 600 are provided which are electrically connected to the vias 314. The electrical connections 600 may be used, as shown by the semiconductor device 750 of FIG. 7, in order to contact a further semiconductor chip 700 (which may be replaced by a stack of semiconductor chips) provided on the bottom surface of the semiconductor carrier 300.

Figure 7:
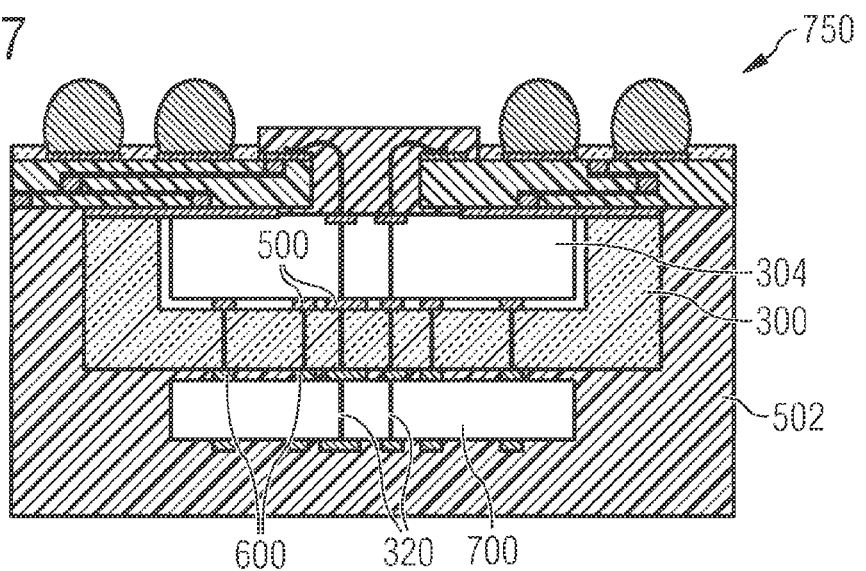
FIG. 7 shows a schematic cross-sectional view of a semiconductor device according to one embodiment.
Figure 8:
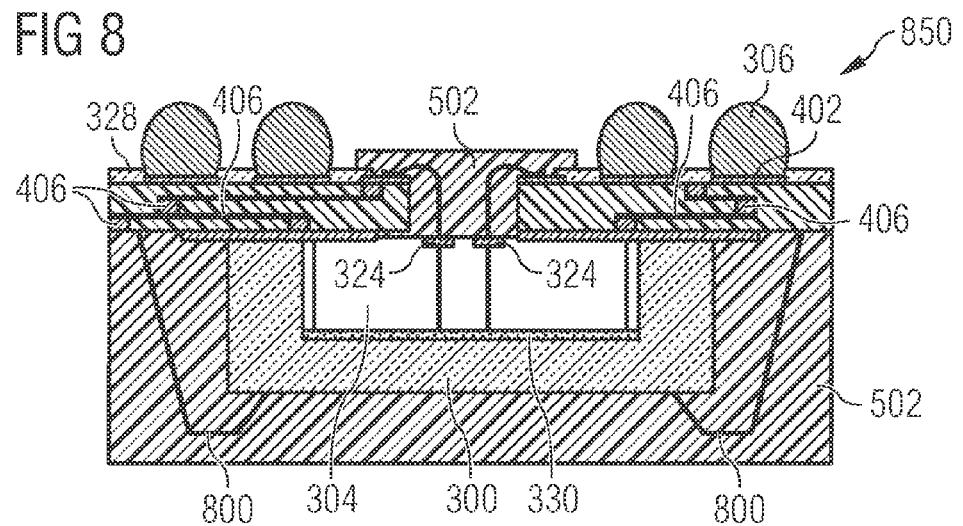
FIG. 8 shows a schematic cross-sectional view of a semiconductor device according to one embodiment.

FIG. 8 shows a semiconductor device 850 where the bottom surface 318 of the semiconductor carrier 300 is not contacted by vias extending through the semiconductor chip 304 and the semiconductor carrier 300 as shown in FIGS. 5 to 7, but by contacting wires 800.

Figure 9A:
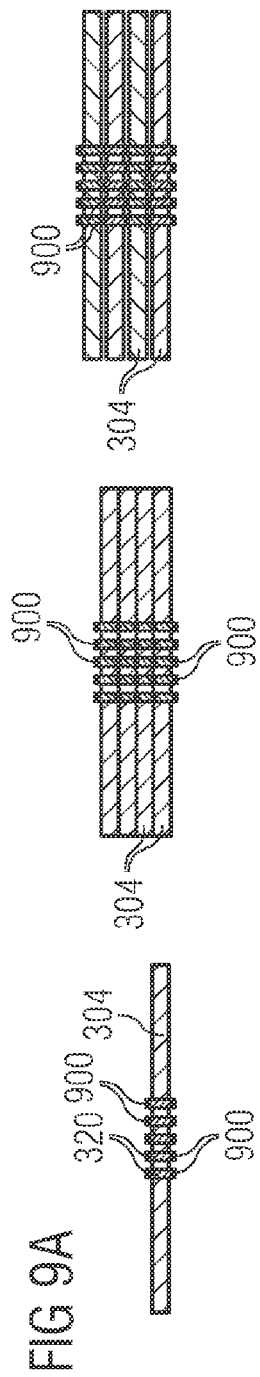
Figure 9B:
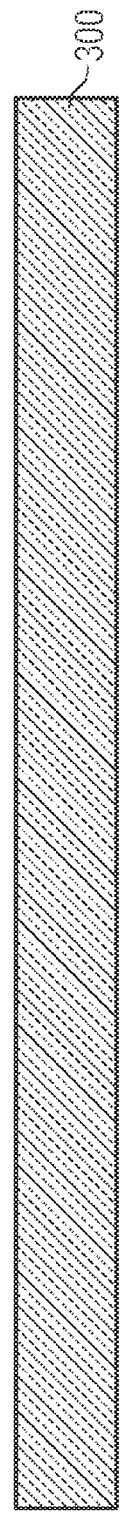
Figure 9C:
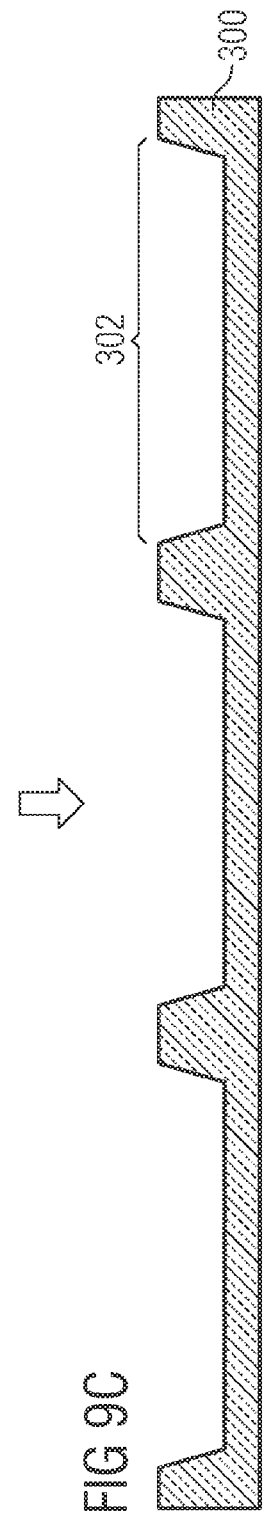
Figure 9D:
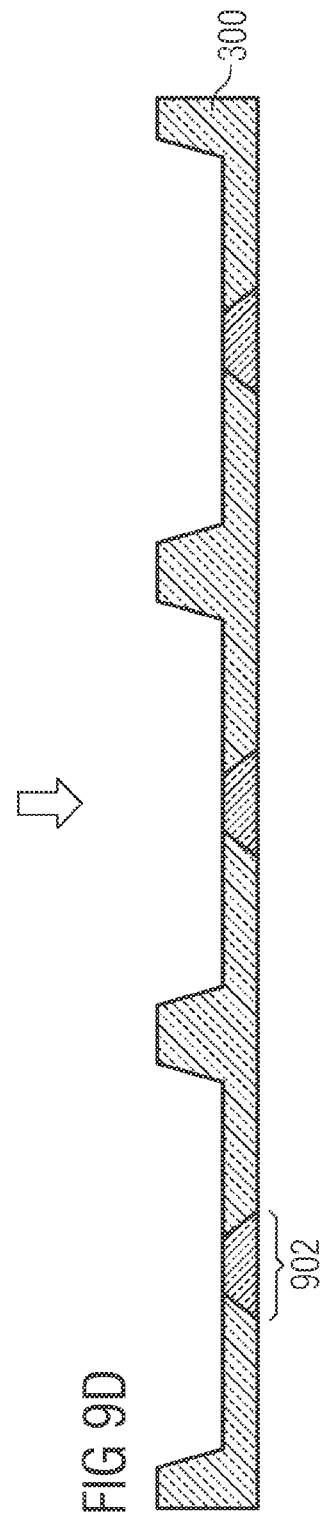
Figure 9K:
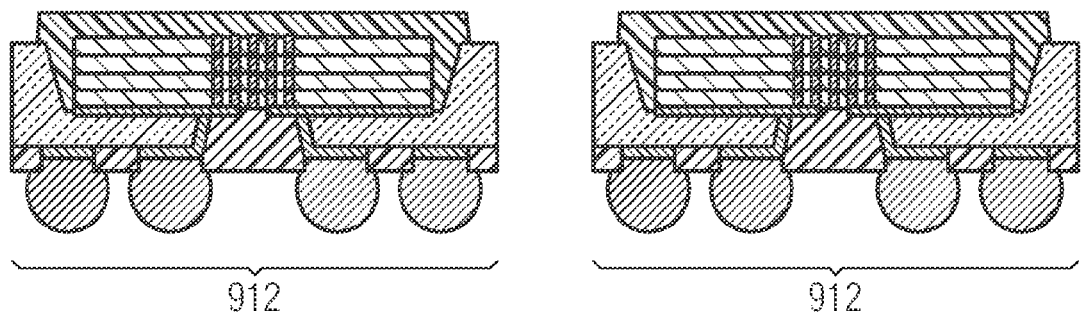

The left part of FIG. 9A shows a manufacturing stage obtained after having formed a semiconductor chip 304 including vias 320 extending through the semiconductor chip 304. Then, as shown in the right part of FIG. 9A, several semiconductor chips 304 are stacked above each other. The stack of semiconductor chips 304 may then be tested. After this, the stack of semiconductor chips is heated such that solder material 900 provided on the top ends and on the bottom ends of the vias 320 melts, thereby forming a permanent electrical connection between the vias 320 of different semiconductor chips 304, as shown in the middle part of FIG. 9A. FIG. 9B shows a manufacturing stage obtained after having provided a semiconductor carrier 300 (wafer). FIG. 9C shows a manufacturing stage obtained after having provided cavities 302 within the semiconductor substrate 300 using, for example, an etching process. FIG. 9D shows a manufacturing stage obtained after having formed via openings 902 within parts of the semiconductor carrier 300 located below the cavities 302. FIG. 9E shows a manufacturing stage obtained after having formed an adhesive layer 904 on the bottom surface 316 of each cavity 302. FIG. 9F shows a manufacturing stage obtained after having placed a stack of semiconductor chips 304 as shown in the middle part of FIG. 9A into each cavity 302, wherein the stack of semiconductor chips 304 is fixed to the semiconductor carrier 300 by the adhesive layer 904. FIG. 9G shows a manufacturing stage obtained after having covered the top surface of the structure thus obtained by a molding material 906 (encapsulation process). FIG. 9H shows a manufacturing stage obtained after having formed a patterned conductive layer 908 on the bottom surface 318 of the semiconductor carrier 300. FIG. 9I shows a manufacturing stage obtained after having provided solder stop material 910 on parts of the bottom surface 318 which is not covered by the patterned conductive layer 908. After this, as shown in FIG. 9J, solder balls 326 are provided on the patterned conductive layer 908. FIG. 9K shows a manufacturing stage obtained after having singularized the semiconductor carrier 300 into semiconductor devices 912.

The left part of FIG. 10A shows a manufacturing stage obtained after having formed a semiconductor chip 304 including vias 320 extending through the semiconductor chip 304. Then, as shown in the right part of FIG. 10A, several semiconductor chips 304 are stacked above each other. The stack of semiconductor chips 304 may then be tested. After this, the stack of semiconductor chips is heated such that solder material 900 provided on the top ends and on the bottom ends of the vias 320 melts, thereby forming a permanent electrical connection between the vias 320 of different semiconductor chips 304, as shown in the middle part of FIG. 10A. FIG. 10B shows a manufacturing stage obtained after having provided a semiconductor carrier 300 (wafer). FIG. 10C shows a processing stage obtained after having formed a plurality of groups of vias 1000 within the semiconductor carrier 300 extending from the bottom surface of the semiconductor carrier into the semiconductor carrier 300. Then, a cavity 302 is formed above each group of vias 1000 such that the top ends of the vias 1000 are exposed, as shown in FIG. 10D. FIG. 10E shows a manufacturing stage obtained after having placed a stack of semiconductor chips 304 within each cavity 302. The stacks of semiconductor chips are placed such into the cavities 302 that the bottom ends of the vias of the lowermost semiconductor chip 304 contact the top ends of the vias of the semiconductor carrier. A heating process may be carried out in order to form both a permanent electrical connection and a permanent mechanical connection between these via ends (formed by solder material provided on the ends of the vias 1000 and 320. FIG. 10F shows a manufacturing stage obtained after having encapsulated the stacks of semiconductor chips 304 by a protection structure like a molding mass 906. FIG. 10G shows a manufacturing stage obtained after having formed a patterned conductive layer 908 on the bottom surface 318 of the semiconductor carrier 300. Further, solder stop material 910 is formed on parts of the bottom surface 318 which is not covered by the patterned conductive layer 908. After this, as shown in FIG. 10H, solder balls 326 are provided on the patterned conductive layer 908. FIG. 10I shows a manufacturing stage obtained after having singularized the semiconductor carrier 300 into semiconductor devices 912.

Figure 11A:
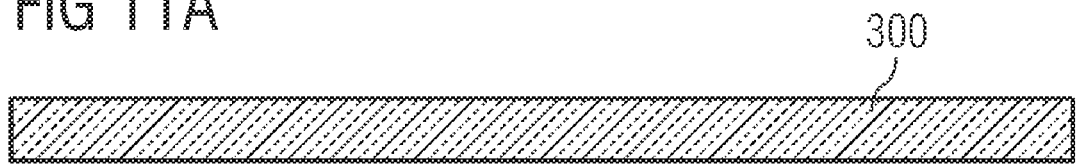
FIGS. 11A to 11E show schematic cross-sectional views of manufacturing stages of a method of manufacturing semiconductor chips according to one embodiment.
Figure 11B:
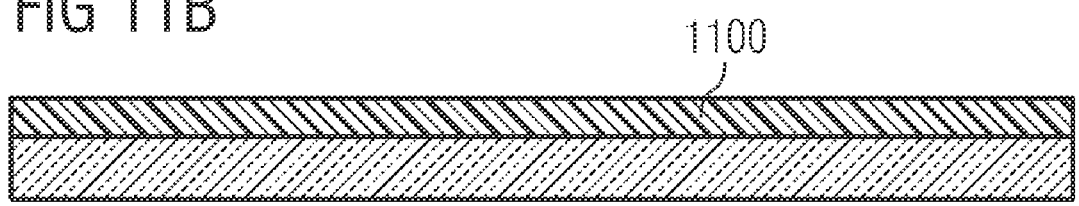
Figure 11C:
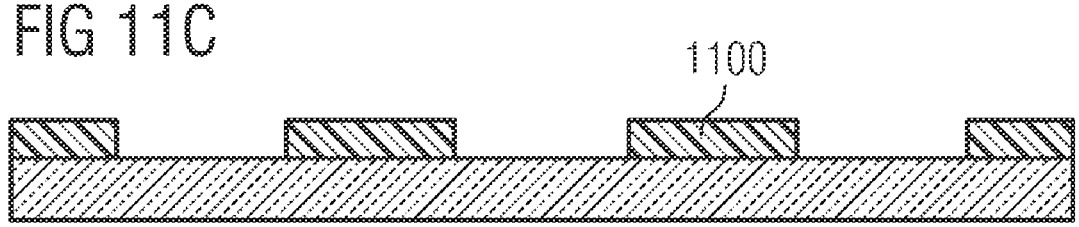
Figure 11D:
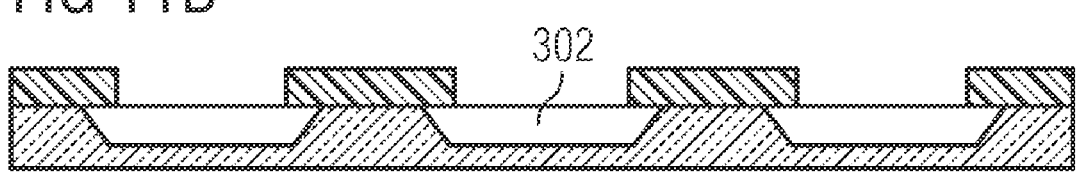
Figure 11E:
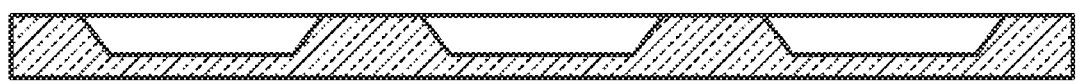

FIGS. 11A to 11E show how the formation of the cavities 302 may be carried out. FIG. 11A shows a manufacturing stage obtained after having provided a semiconductor wafer 300. FIG. 11B shows a manufacturing stage obtained after having formed a photo resist film 1100 on the semiconductor wafer 300. FIG. 11C shows a manufacturing stage obtained after having structured the photo resist film 1100. FIG. 11D shows a manufacturing stage obtained after having etched cavities 302 into the semiconductor wafer 300 using, for example, a KOH anisotropic etching process. After this, the photo resist film 1100 is removed using, for example, a stripping process, as shown in FIG. 11E.

Figure 13A:
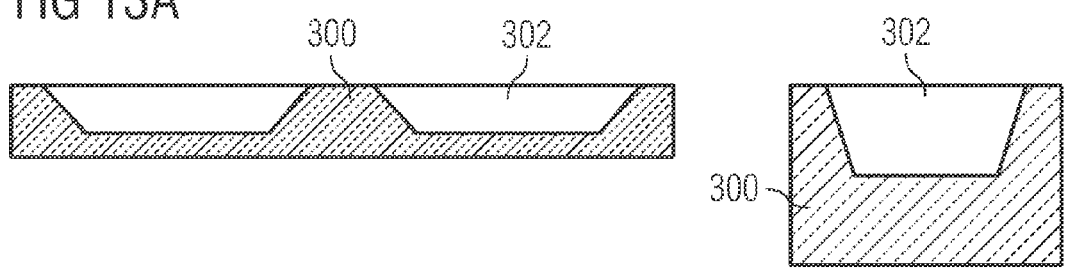
FIGS. 13A to 13C show schematic cross-sectional views of manufacturing stages of a method of manufacturing semiconductor chips according to one embodiment.
Figure 13B:
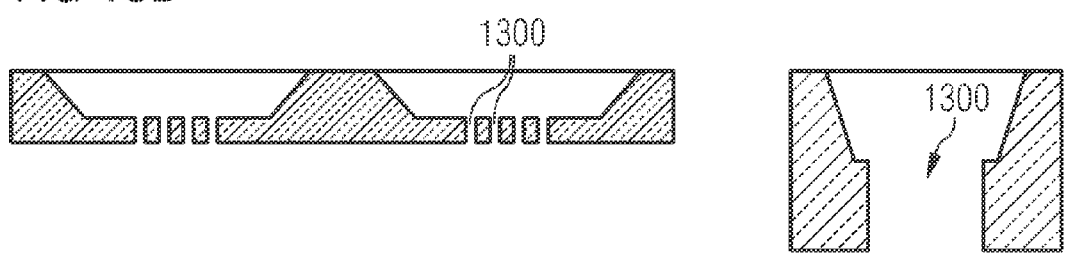
Figure 13C:
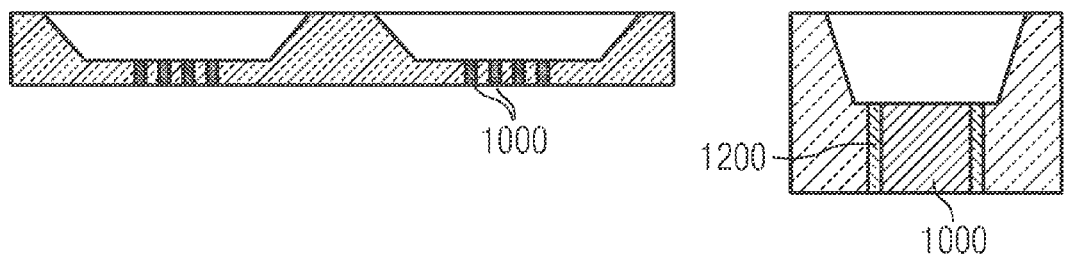

As shown in FIGS. 12A and 12B, the vias 1000 extending through the semiconductor carrier 300 may be formed (FIG. 12A) before forming the cavities 302 (FIG. 12B). Here, the vias 1000 are laterally surrounded by a via liner 1200. The top ends of the vias 1000 may be exposed during the cavity etch or after this using additional processes. As shown in FIGS. 13A and 13B, the vias 1000 extending through the semiconductor carrier 300 may be formed (FIGS. 13B and 13C) after forming the cavities 302 (FIG. 13A). The formation of the vias 1000 is carried out by forming via openings 1300 within the semiconductor carrier 300 using, e.g., DRIE, laser drilling, or wet etch processes (FIG. 13B), and by filling the via openings 300 with conductive material (FIG. 13C).

According to one embodiment of the present invention, a semiconductor device is provided, including: a semiconductor carrier; a cavity formed within the semiconductor carrier, the cavity extending from the top surface of the semiconductor carrier into the semiconductor carrier; and at least one semiconductor chip provided within the cavity, wherein the at least one semiconductor chip include at least one integrated circuit.

According to one embodiment of the present invention, the vertical position of the top surface of the uppermost semiconductor chip provided within the cavity is lower than the vertical position of the top surface of the semiconductor carrier.

According to one embodiment of the present invention, the at least one semiconductor chip includes chip contacting areas for contacting at least one integrated circuit provided within the at least one semiconductor chip, the chip contacting areas being located on the bottom surface of the at least one semiconductor chip, and wherein the semiconductor device includes device contacting areas for externally contacting the device which are located on the bottom surface of the semiconductor carrier, wherein the chip contacting areas are electrically connected to the device contacting areas by vias extending through the semiconductor carrier. According to one embodiment of the present invention, the at least one semiconductor chip includes chip contacting areas for contacting at least one integrated circuit provided within the semiconductor chip, the chip contacting areas being located on the top surface of the at least one semiconductor chip.

According to one embodiment of the present invention, the chip contacting areas are the device contacting areas.

According to one embodiment of the present invention, the semiconductor device includes a circuit board provided on the top surface of the at least one semiconductor chip or on the top surface of the semiconductor carrier, wherein the semiconductor device has device contacting areas being located on the top surface of the circuit board, wherein the chip contacting areas are electrically connected to the device contacting areas by electrical connections provided within or on the circuit board.

According to one embodiment of the present invention, the device contacting areas are connected to semiconductor carrier contacting areas located on the bottom surface, side surface or top surface of the semiconductor carrier using electrical connections provided within or on the circuit board.

According to one embodiment of the present invention, the at least one semiconductor chip includes chip contacting areas for contacting the at least one integrated circuit which are located on the bottom surface of the at least one semiconductor chip, and wherein the semiconductor carrier includes vias extending through the semiconductor carrier which are electrically connected to the chip contacting areas provided on the bottom surface of the at least one semiconductor chip.

According to one embodiment of the present invention, at least one semiconductor chip is provided on the bottom surface of the semiconductor carrier, wherein, on the surface of the at least one semiconductor chip facing the semiconductor carrier, chip contacting areas are provided which are electrically connected to the vias extending through the semiconductor carrier.

According to one embodiment of the present invention, the semiconductor carrier constitutes a semiconductor chip including at least one integrated circuit which, together with at least one integrated circuit provided within the at least one semiconductor chip, is connected to device contacting areas for externally contacting the semiconductor device.

That is, according to one embodiment of the present invention, the semiconductor carrier may itself be a semiconductor chip comprising an integrated circuit, wherein, within the back side of the semiconductor chip constituting the semiconductor carrier, a cavity has been formed. In other words: two semiconductor chips are stacked above each other, each of them including at least one integrated circuit, wherein one of the semiconductor chips serves as a semiconductor carrier for the (at least one) other semiconductor chip which is placed within a cavity formed within the semiconductor chip serving as semiconductor carrier.

According to one embodiment of the present invention, the part of the semiconductor carrier including the integrated circuit is located below the cavity formed within the semiconductor carrier.

According to one embodiment of the present invention, at least a part of the semiconductor device is encapsulated by a protecting means like a molding mass.

According to one embodiment of the present invention, the at least one semiconductor chip includes vias extending through the at least one semiconductor chip.

According to one embodiment of the present invention, the semiconductor carrier includes vias extending through the semiconductor carrier, wherein the vias of the carrier substrate are connected to the vias of the at least one semiconductor chip.

According to one embodiment of the present invention, the vias extending through the semiconductor carrier are formed by contact holes which are completely filled with conductive material.

According to one embodiment of the present invention, the vias extending through the semiconductor carrier are formed by contact holes and a layer of conductive material which covers the side surface of the contact holes.

According to one embodiment of the present invention, the at least one semiconductor chip is a stack of semiconductor chips, wherein the semiconductor chips include vias which extend through the semiconductor chips, the ends of the vias of different semiconductor chips which face each other being electrically connected with each other.

According to one embodiment of the present invention, the at least one semiconductor chip is attached to the bottom surface of the cavity by an adhesive layer.

According to one embodiment of the present invention, the adhesive layer is a solder material layer.

According to one embodiment of the present invention, the adhesive layer is an epoxy layer.

According to one embodiment of the present invention, the adhesive layer is a tape layer.

According to one embodiment of the present invention, the adhesive layer has a thickness ranging between 5 μm and 100 μm.

According to one embodiment of the present invention, the adhesive layer has a thickness ranging between 5 μm and 50 μm.

According to one embodiment of the present invention, the adhesive layer has a thickness ranging between 10 μm and 20 μm.

According to one embodiment of the present invention, the adhesive layer has a high thermal conductivity.

According to one embodiment of the present invention, the depth of the cavity ranges between 60 μm and 500 μm.

According to one embodiment of the present invention, the thickness of the parts of the semiconductor carrier located below the cavities is lower than 200 μm.

According to one embodiment of the present invention, the thickness of the parts of the semiconductor carrier located below the cavities is larger than 50 μm in order to ensure sufficient mechanical stability of the semiconductor carrier.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A semiconductor device, comprising:
a semiconductor carrier,
a cavity formed within the semiconductor carrier, the cavity extending from a top surface of the semiconductor carrier into the semiconductor carrier, and
at least one semiconductor chip provided within the cavity, wherein the vertical position of the top surface of the at least one semiconductor chip provided within the cavity is lower than the vertical position of the top surface of the semiconductor carrier,
wherein the at least one semiconductor chip comprises vias extending through the at least one semiconductor chip,
wherein the semiconductor carrier comprises vias extending through the semiconductor carrier, and
wherein vias of a carrier substrate are connected to the vias of the at least one semiconductor chip.

2. The semiconductor device according to claim 1, wherein the vias extending through the semiconductor carrier are formed by contact holes that are completely filled with conductive material.

3. The semiconductor device according to claim 1, wherein the vias extending through the semiconductor carrier are formed by contact holes and a layer of conductive material that covers a side surface of the contact holes.

4. The semiconductor device according to claim 1, wherein the at least one semiconductor chip comprises a stack of semiconductor chips, wherein the semiconductor chips comprise vias that extend through the semiconductor chips, ends of the vias of different semiconductor chips which face each other being electrically connected with each other.

5. The semiconductor device according to claim 1, wherein the at least one semiconductor chip is attached to a bottom surface of the cavity by an adhesive layer.

6. The semiconductor device according to claim 5, wherein the adhesive layer comprises a solder material layer.

7. The semiconductor device according to claim 5, wherein the adhesive layer comprises an epoxy layer.

8. The semiconductor device according to claim 5, wherein the adhesive layer comprises a tape layer.

9. The semiconductor device according to claim 5, wherein the adhesive layer has a thickness ranging between 5 μm and 100 μm.

10. The semiconductor device according to claim 5, wherein the adhesive layer has a high thermal conductivity.

11. The semiconductor device according to claim 1, wherein the cavity has a depth that ranges between 60 μm and 500 μm.

12. The semiconductor device according to claim 11, wherein a thickness of parts of the semiconductor carrier located below the cavity is less than 200 μm.

* * * * *